United States Patent [19]

Guillot

[11] Patent Number: 5,054,001

[45] Date of Patent: Oct. 1, 1991

[54] TRANSISTOR BREAKDOWN PROTECTION CIRCUIT

[75] Inventor: Pierre Guillot, Geneva, Switzerland

[73] Assignee: Motorola, Inc., Schaumburg, Ill.

[21] Appl. No.: 474,008

[22] PCT Filed: Aug. 3, 1989

[86] PCT No.: PCT/EP89/00917

§ 371 Date: Apr. 16, 1990

§ 102(e) Date: Apr. 16, 1990

[87] PCT Pub. No.: WO90/02405

PCT Pub. Date: Mar. 8, 1990

[30] Foreign Application Priority Data

Aug. 19, 1988 [GB] United Kingdom ................. 8819733

[51] Int. Cl.[5] .......................................... G11C 13/00
[52] U.S. Cl. .................................. 365/226; 365/227; 307/450

[58] Field of Search ....................... 365/226, 227, 333; 307/450

[56] References Cited

U.S. PATENT DOCUMENTS

| 4,337,525 | 6/1982 | Akatsuka | 365/233 |
| 4,384,220 | 5/1983 | Segawa et al. | 365/227 |
| 4,385,369 | 5/1983 | Sheppard | 365/227 |

Primary Examiner—Terrell W. Fears
Attorney, Agent, or Firm—Michael D. Bingham; Bradley J. Botsch

[57] ABSTRACT

This invention relates to transistor breakdown protection circuits for use in high voltage circuitry. This inventions relates more particularly to memory systems such as Electrically Erasable Programmable Read Only Memory (EEPROM), or Non-Volatile Random Access Memory (NVRAM) which require high voltages for write and erase operations.

9 Claims, 2 Drawing Sheets

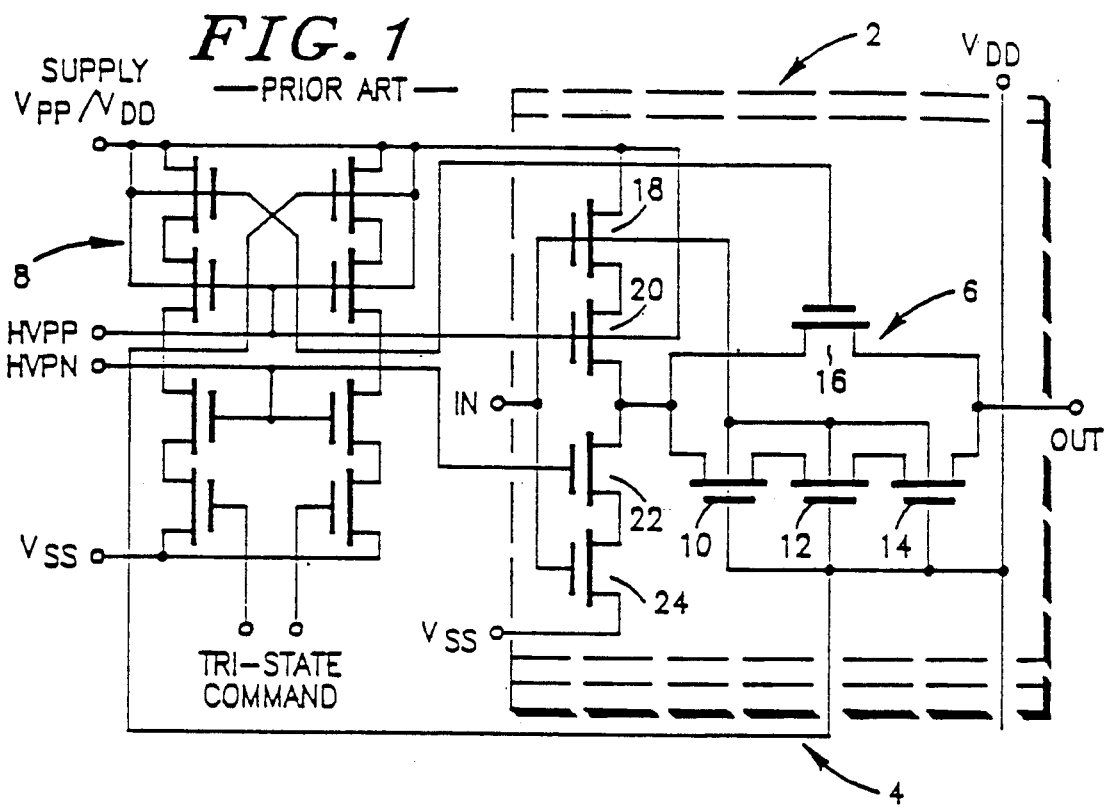
*FIG. 1* —PRIOR ART—
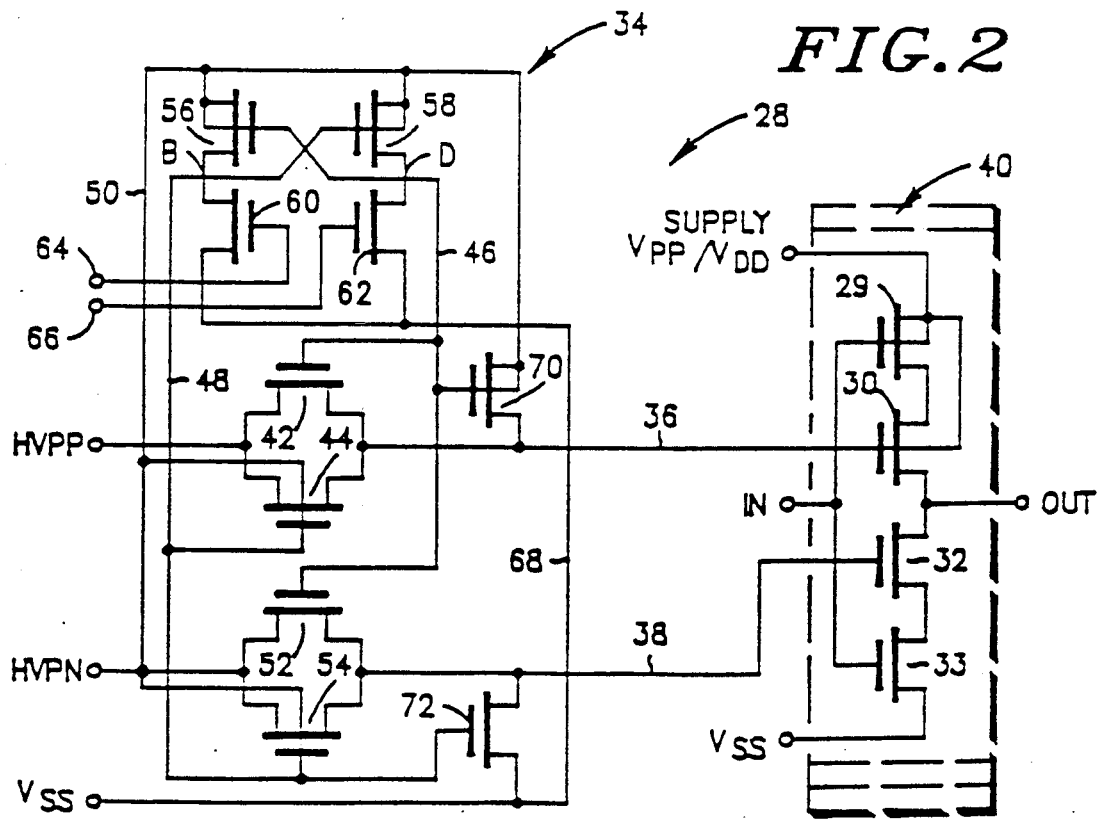
*FIG. 2*

TRANSISTOR BREAKDOWN PROTECTION CIRCUIT

SUMMARY OF THE DISCLOSURE

In memory systems such as EEPROM or NVRAM, to transfer program and/or data a high voltage is required to write to or erase the memory cells and therefore, to avoid voltage breakdown in the buffer transistors of the memory cells at high voltages, protecting transistors are provided in connection with the buffer gates. The protecting transistors are only useful during the write/erase operation and at all other times the voltage applied to the protecting transistors' gates are selected so that the protecting transistors are switched "on" so as not to disturb the logic function of the memory system.

Such an arrangement is used in the MC68HC11 EEPROM write amplifier supplied by Motorola Inc. which is also designed so that it can operate with a three state function output. The tristate function is realised by a transmission gate able to support high voltage and which is coupled to the buffer gates. The transmission gate is made up of four coupled transistors. Since the buffer and transmission gate are connected to each column of the EEPROM memory a large number of transistors are required to create a tristate function resulting in greater circuit size and cost.

A similar arrangement of buffer gates and protecting transistors is found in the RAM cells of Non-Volatile RAM (NVRAM) memory systems such as that described in Applicant's UK patent application (No. 8702785) entitled "Memory System", the disclosure of which is hereby incorporated herein by reference. As with the above described write amplifier, in the memory system a high voltage for write/erase operation is required However it is also important to perform a full preset of the entire RAM array before performing a recall. This can be achieved by individually pulling down each cell using a respective transistor, however this requires a large number of transistors. The above referred to UK application discloses presetting the memory cells by using a single pull-down transistor per column. However, a very large transistor is required to pull-down all the RAM cells on the same column which can create significant power consumption and can make the preset difficult.

It is an object of the present invention to provide a high voltage transistor breakdown protection circuit for a memory system wherein the above disadvantages may be obviated.

In accordance with the present invention there is provided a high voltage transistor breakdown protection circuit comprising:

protecting means having a first and a second input;

protection control means coupled to said first and second inputs of said protecting means to apply first and second signals thereto, said protecting means assuming a protecting or a non-protecting mode in dependence on said protection control means applying to said first and second inputs first and second combinations of said first and second signals, characterised by, said protecting means being arranged to assume a third mode and a fourth mode in dependence on said protection control means applying to said first and second inputs third and fourth combinations of said first and second signals.

Thus, it will be appreciated that by replacing the transmission gate and the high voltage translator of the write amplifier by a circuit wherein the protection transistors are used both as protection against breakdown in the buffer transistors at high voltages and for creating the tristate function at low voltages, the number of transistors are reduced considerably, which reduces the circuit size and cost. Thus power consumption will be decreased and working safety improved.

It will also be appreciated that by using such a protecting circuit arrangement in the RAM cell of a NVRAM memory system a tristate effect can be created into the RAM cell thereby making the preset easier since the pull-up action of the p transistors in the memory cell during preset activation can now be disabled. Thus a large transistor is not required thereby reducing the power consumption.

Two memory systems in accordance with the present invention will now be described, by way of example only, with reference to the accompanying drawings, in which:

FIG. 1 is a schematic diagram showing the circuit of a write amplifier of a prior art memory system;

FIG. 2 is a schematic diagram showing the circuit of a write amplifier of a first memory system in accordance with the present invention;

Figure 3:
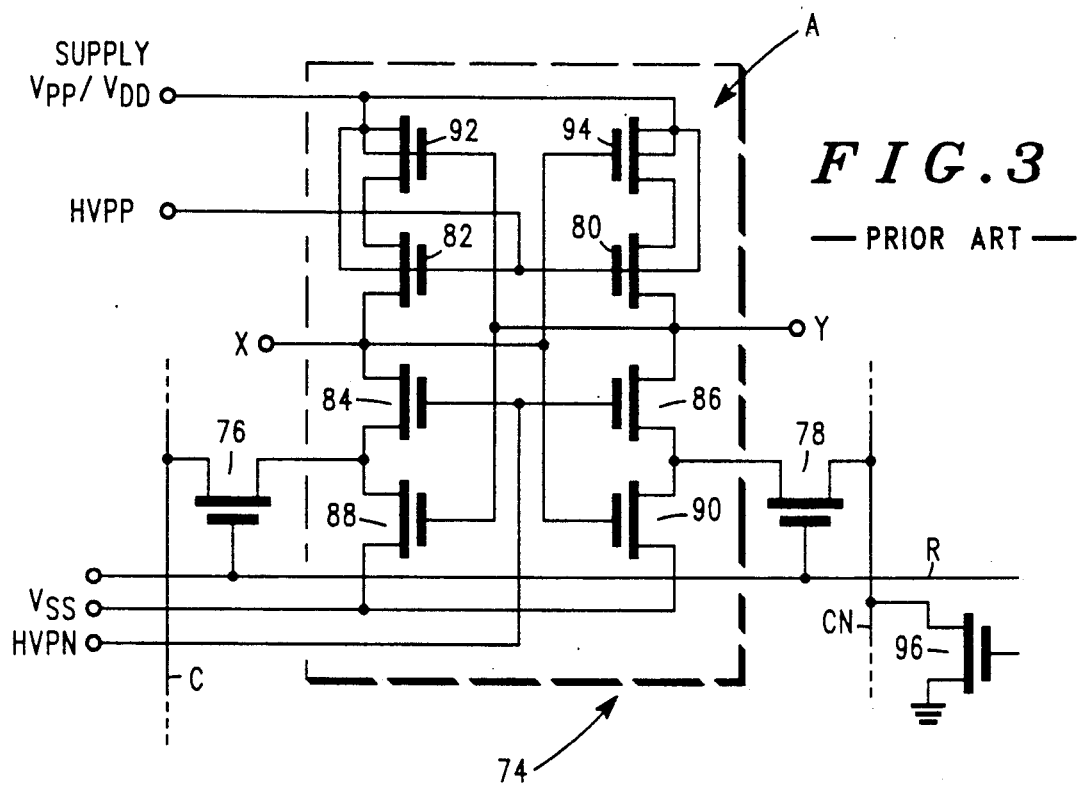
FIG. 3 is a schematic diagram showing the circuit of part of a prior art NVRAM memory system.

Referring firstly to FIG. 1, the write amplifier 2 has a plurality of inverters, only one of which 4 is shown, such that each inverter 4 is connected to one row of cells in a single plate of EEPROM memory (not shown). The inverter 4 comprises a transmission gate 6, which is made up of four field effect transistors (FET) 10, 12, 14, 16 and a group of four transistors 18, 20, 22, 24 coupled in series, comprising two buffer gates 18, 24 and two protection transistors 20, 22. Two voltage supply lines HVPP and HVPN connected to the gates of the protecting transistors 20 and 22 respectively, control the "on/off" state of the protecting transistors. The gate electrodes of the buffer gates 18, 24 are coupled to form the input of the inverter 4 and the second electrodes of the FETs 14, 16 of the transmission gate are coupled to form the output of the inverter 4.

In operation of the write amplifier 2, for a write operation a high voltage is supplied to the write amplifier 2 from a supply line (usually at voltage $V_{DD}$) pulled to the programming voltage $V_{pp}$. The lines HVPP and HVPN are pulled high so that a voltage $V_{HN}$ is applied to the gates of the protecting transistors 20 and 22. When a low voltage $V_{SS}$ is applied to the input of the inverter 4, protecting transistor 20 is switched "on" and protecting transistor 22 provides protection against breakdown in the buffer transistor 24. When a high voltage $V_{DD}$ is applied to the input of the inverter 4, protecting transistor 22 is switched "on" and protecting transistor 20 provides protection against breakdown in the buffer transistor 18. When a write operation is not being performed, the supply line is pulled to the lower voltage $V_{DD}$ and in order that the protecting transistors 20, 22 do not disturb the logic function of the inverter 4, the HVPN line is held at the potential $V_{HN}$ so that the protecting transistor 22 is "on" and the HVPP line is pulled to the potential $V_{SS}$ so that the protecting transistor 20 is switched "on". A three state output, such as in the MC68HC11 EEPROM write amplifier supplied by Motorola Inc, is generated by the transmission gate 6 whose state is controlled by a driver 8. Thus to command the transmission gate 6, a high voltage is applied to the gates of two of the FETs 12, 16. Such a write amplifier is well known in the art.

Referring now to FIG. 2, in order to reduce the number of transistors which are required for the write amplifier referred to above, while still providing protection against voltage breakdown at a high supply voltage $V_{pp}$ as well as providing a tristate function output at a lower supply voltage $V_{DD}$, the two protection transistors are used to perform both functions. The manner in which this is achieved will be described fully below.

In a preferred embodiment of the present invention the write amplifier 28 of FIG. 2 has a command block 34 and a plurality of inverters, only one of which 40 is shown, such that each inverter is associated with one row of cells in a plane of EEPROM memory (not shown). The inverters are supplied from a common supply line (normally at voltage $V_{DD}$) and a line a datum potential $V_{SS}$. The inverter 40 includes four FET transistors 29, 30, 32, 33 coupled together in series by their current electrodes. The first and second transistors are p-channel FETs, the third and fourth are n-channel FETs. The gate electrodes of the first and fourth FETs 29, 33 form the input of the inverter 40 and the second current electrodes of the second and third FETs 30, 32 are coupled to form the output of the inverter 40. The first current electrode of the first FET 29 is coupled to the supply line and also to the bulk electrode of the second FET 30, and the bulk electrode of the first FET 29 is also tied to this first current electrode. The fourth FET 33 is connected to the line at datum potential $V_{SS}$. The gate electrodes of the second and third FETs 30, 32 are coupled to the command block 34 by two voltage lines 36, 38 respectively. By commanding the voltages applied to the gates of the second and third FETs 30, 32, the command block 34 can control whether these FETs 30 and 32 act as protection transistors when the supply voltage is $V_{pp}$ or are used to create the tristate function when the supply voltage is $V_{DD}$.

The common block 34 includes four switching transistors 42, 44, 52, 54 and four command transistors 56, 58, 60, 62.

The voltage line 36 is connected to the HVPP line via the first and second switching transistors 42, 44 coupled in parallel. The first current electrode of the first switching transistor 42 is connected together with the second current electrode of the second switching transistor 44 to the voltage line 36, and the second current electrode of the first switching transistor 42 is connected together with the first current electrode of the second switching transistor 44 to the HVPP line. The first switching transistor 42 is a n-channel FET whose gate electrode is connected to a fourth common voltage line 46. The second switching transistor 44 is a p-channel FET, whose gate electrode is connected to a third common voltage line 48 and whose bulk electrode is connected to a first common voltage line 50. The first common voltage line 50 is connected to the HVPN line.

The voltage line 38 is connected to the HVPN line and the first common voltage line 50 via the third and fourth switching transistors 52, 54 coupled in parallel in an identical way to that described above for the voltage line 36. The third switching transistor 52 is a n-channel FET and the fourth switching transistor 54 is a p-channel FET.

The first and third command transistors 56, 60 are coupled together in series by way of the current electrodes as are the second and fourth command transistors 58, 62. The first and second command transistors 56, 58 are p-channel enhancement FETs, whose gate electrodes are cross-coupled respectively to the second and first nodes D and B located between the first current electrodes of the fourth and third command transistors 62, 60 respectively. The nodes B and D are connected respectively to the third and fourth common voltage lines 48, 46. The first current electrodes of the first and second command FETs 56, 58 are coupled to the first common voltage line 50 for receiving a voltage supply from the HVPN line and these first current electrodes are also connected to their respective bulk electrodes. The third and fourth command transistors are n-channel FET whose gates are coupled to tristate command lines 64, 66 respectively for receiving mode command signals and whose second current electrodes are both connected to a second common voltage line 68 at datum potential $V_{SS}$.

The first common voltage line 50 is coupled to the voltage line 36 via the first current electrode of a p-channel enhancement FET 70 whose gate electrode is connected to the fourth common voltage line 46 and whose bulk electrode is connected to the first current electrode. The second common voltage line 68 at voltage $V_{SS}$ is coupled to the voltage line 38 via the second current electrode of a n-channel FET 72 whose gate electrode is connected to the third common voltage line 48.

In use of the write amplifier 28 during a write operation, a high programming voltage $V_{pp}$ is supplied from the supply line to the inverter 40 and in order to protect against breakdown in the buffer transistors 29, 33, which may occur when the voltage applied to the input of the inverter 40 is high, $V_{DD}$, and low, $V_{SS}$, respectively, the voltages on both the HVPP and HVPN lines are pulled up to a voltage $V_{HN}$.

A voltage $V_{HN}$ is therefore applied to the gate electrodes of the intermediate FETs 30, 32, via the switching transistors 42, 44 and 52, 54 respectively, so that when the voltage applied to the input of the inverter 40 is low, $V_{SS}$, the FET 30 is switched "on" and FET 32 provides protection whereby the voltage applied to the buffer transistor 33 is prevented from reaching the breakdown voltage limit. When the voltage applied to the input of the inverter 40 is high, $V_{DD}$, the FET 32 is switched "on" and the FET 30 provides protection whereby the voltage applied to the buffer transistor 29 is prevented from reaching the breakdown voltage limit. In both cases the limit is dependent on the particular transistors utilised. When a write operation is not being performed a low voltage $V_{DD}$ is supplied from the supply line and by controlling the voltages on the HVPP and HVPN lines by way of the four command transistors 56, 58, 60, 62 which are in turn controlled by the tristate command lines 64, 66 the intermediate FETs 30, 32 can be switched "on" or "off" thereby creating the tristate function. Therefore, when the supply line is at potential $V_{DD}$ the output from the inverter 40 can be one of three possible states: binary '1' (potential $V_{DD}$), binary '0' (potential $V_{SS}$) and floating.

It will be appreciated, therefore, that since the write amplifier 28 in accordance with the present invention has eliminated the need to use the four transistors 10, 12, 14, 16 of the transmission gate 6 of FIG. 1 for each column of cells in a single plane of EEPROM memory, the number of transistors which are required have been considerably reduced.

Referring now to FIG. 3, the static RAM cell 74, which is one cell of an array of identical cells of the RAM structure which forms part of a NVRAM memory system, includes two FETs 76, 78 having their current electrodes coupled in series between a pair of split column select lines C, CN. The gate electrodes of the FETs 76, 78 are connected to a row select line R, and an inverting buffer amplifier arrangement A is connected between the FETs 76, 78 and supplied from a supply line (normally at voltage $V_{DD}$) and a line a datum potential $V_{SS}$. Such a static RAM cell for NVRAM memory systems structure is more fully described in the present Applicant's UK patent application entitled "Memory System" which has been referred to above.

To transfer program and/or data from the RAM cell requires a high voltage $V_{pp}$ supplied from the supply line, and therefore the inverting buffer amplifier arrangement A includes p-channel FETs 80, 82 and n-channel FETs 84, 86 which protect the buffer transistors 88, 90, 92, 94 against voltage breakdown. The gates of the p-channel protection transistors 80, 82 are coupled to a voltage line HVPP and the gates of the n-channel protection transistors 84, 86 are coupled to a voltage line HVPN. When the supply line is pulled to the programming voltage $V_{pp}$, both the HVPP and the HVPN lines are pulled high so that a voltage $V_{HN}$ is applied to the gates of the protecting transistors 80, 82, 84, 86. Thus, when node Y is at a potential $V_{SS}$ (node X is at a potential $V_{DD}$), protecting transistors 82 and 86 are switched "on" and protecting transistors 80 and 84 provide protection against breakdown in the buffer transistors 88 and 94. When node Y is at a potential $V_{DD}$ (node X is at a potential $V_{SS}$), protecting transistors 82 and 86 provide protection against breakdown in the buffer transistors 90 and 92.

Before a recall operation can be performed it is important that a full preset of all the RAM array is made. The RAM cells 74 are preset by using a single pull down per column to a voltage $V_{SS}$ via a transistor 96 on each cell's column select line CN. However, pulling down all the cells on the same column creates difficulty in performing the preset and since a large transistor must be used in order to turn the RAM cells, significant power consumption results.

Figure 4:
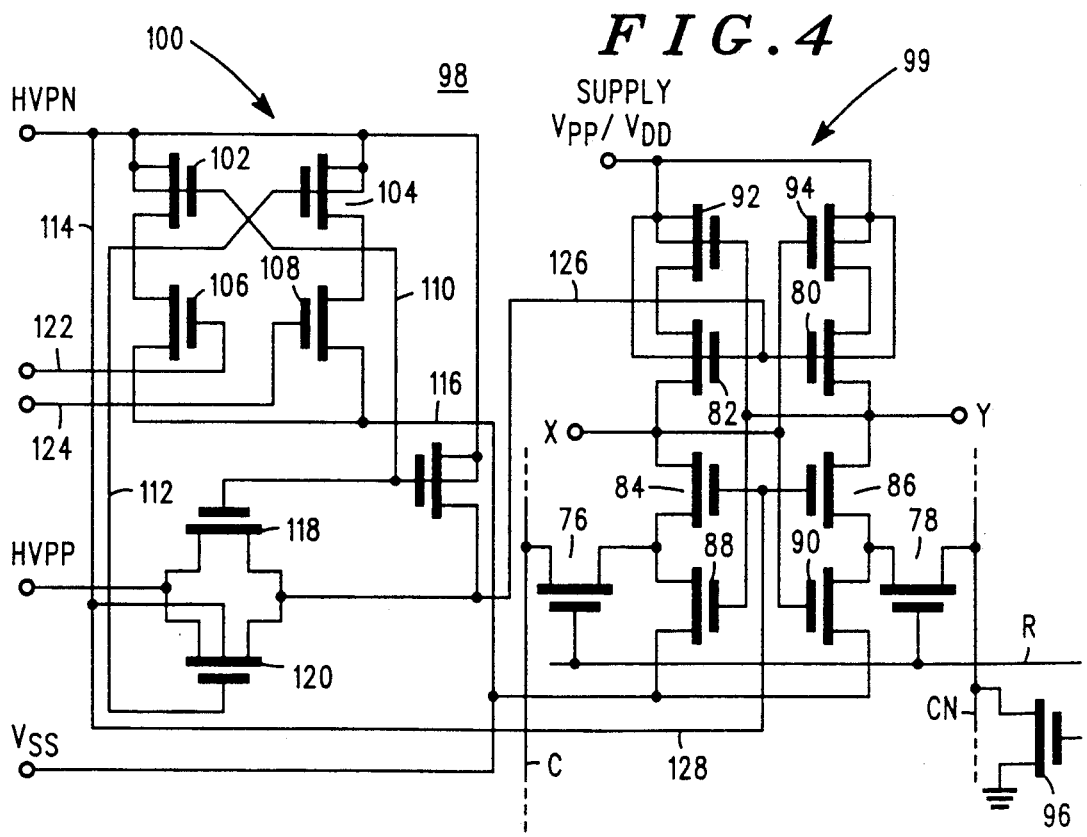
FIG. 4 is a schematic diagram showing the circuit of part of a second memory system in accordance with the present invention.

Referring now also to FIG. 4, in order to circumvent these problems a second embodiment of the present invention is incorporated in a RAM cell 98 for NVRAM application. The RAM cell 98 includes a RAM cell of the same structure as shown in FIG. 3, but wherein the gate electrodes of the p- and n-channel protecting transistors 82, 80 and 84, 86 are coupled respectively by two voltage lines 126, 128 to the HVPP and the HVPN lines via a command block 100. As shown, like components to those of FIG. 3 are referenced by the same numerals.

In the RAM cell of FIG. 4, the voltages applied to the gates of the p-channel protecting transistors 80, 82 and n-channel protecting transistors 84, 86 are controlled by the command block 100. The command block 100 is similar to that of the command block 34 of the write amplifier 28 in FIG. 2 in that there are four command transistors 102, 104, 106, 108 interconnected identically to the command transistors 56, 58, 60, 62 of the write amplifier, and four common voltage lines 114, 116, 112, 110. The second common voltage line 116 at datum potential $V_{SS}$ is coupled to the datum potential line of the RAM cell 99. However, during a full preset activation of the RAM array only the state of the p-channel protecting transistors 82, 80 need be controlled. In order to make the preset easier, therefore, the command block 100 has only two switching transistors 118, 120 coupled between the HVPP line and the voltage line 126 to control the voltage applied to the p-channel protecting transistors 80, 82. The HVPN line connects to the voltage line 128 by way of the first common voltage line 114.

The command transistors 102, 104, 106, 108 are controlled by the voltage on two pull-up inhibit lines 122, 124 applied to the gate electrodes of the command transistors 106, 108 and this allows for the disabling of the p-channel protection transistors 80, 82.

During a write operation, when the voltage supplied from the supply line is high, $V_{PP}$, both the HVPP and HVPN lines are pulled up to the voltage $V_{HN}$. Thus by applying potential $V_{HN}$ to the gate electrodes of the protecting transistors 80, 82, 84, 86 protection is provided against breakdown in the buffer transistors 88, 90, 92, 94 of the RAM cell 99. When a low voltage, $V_{SS}$, is applied to node Y, the protecting transistors 82 and 86 are switched "on" and 80 and 84 provide protection whereby the voltages applied to the buffer transistors 88 and 94 respectively are prevented from reaching the breakdown voltage limit. When a high voltage, $V_{DD}$, is applied to node Y the protecting transistors 80 and 84 are switched "on" and 82 and 86 provide protection whereby the voltages applied to the buffer transistors 90 and 92 are respectively prevented from reaching the breakdown voltage limit.

Before program and/or data can be transferred to the RAM array of the NVRAM memory system (not shown), the RAM cells 99 must be preset via a transistor 96 on each cell's column select line CN. During preset activation, the voltage supply line is at a voltage $V_{DD}$ and the voltage supplied to the gate electrodes of the p-channel protecting transistors 80, 82, which is controlled by the pull-up inhibit lines 122, 124, is pulled to $V_{HN}$ switching the p-channel protecting transistors 80, 82 "off". By disabling the p-channel protecting transistors 80, 82 the column select line CN of a column of RAM cells 99 in the array can be pulled down by one transistor 96 to a potential $V_{SS}$ thereby making the preset easier and also with reduced power consumption since a smaller transistor can be used. The pull-up inhibit of the p-channel protecting transistors is then deselected by controlling the voltage on the pull-up inhibit lines 122, 124, which restores the flip-flop function of the RAM cell. Thus, having the column select line CN pulled down to a potential $V_{SS}$ and with transistors 76, 78 switched "on", when the p-channel protecting transistors 80, 82 are switched "on", binary '0' (potential $V_{SS}$) will be latched on node Y and binary '1' (potential $V_{DD}$) will be latched on node X.

It will be appreciated that the only difference between the two embodiments of the invention herein described, with reference to FIGS. 2 and 4, lies in the fact that at low supply voltage $V_{DD}$ with the NVRAM cell of FIG. 4 only the conducting state of the p-channel protecting transistors 80, 82 need be controlled, in order to inhibit the pull-up action of the cell, and therefore a real tristate effect is not required like that which is created in the write amplifier described with reference to FIG. 2.

In the specific examples described above in accordance with the invention, transistors fabricated in N-well technology have been utilised, wherein, p-channel transistors are represented with four electrodes and n-channel transistors with three electrodes. With a p-channel transistor the bulk electrode connection is explicitly drawn so as to indicate at which potential the channel is connected. However, with a n-channel transistor this connection need not be shown as the n-channel transistors are implemented directly in the substrate which is tied to the ground voltage.

What is claimed is:

1. A high voltage transistor breakdown protection circuit comprising:
    protecting means having a first and a second input;
    protection control means coupled to said first and second inputs of said protecting means to apply first and second signals thereto,
    said protecting means assuming a protecting or a non-protecting mode in dependence on said protection control means applying to said first and second inputs first and second combinations of said first and second signals, characterised by,
    said protecting means being arranged to assume a third mode and a fourth mode in dependence on said protection control means applying to said first and second inputs third and fourth combinations of said first and second signals.

2. A high voltage transistor breakdown protection circuit according to claim 1 wherein said third and fourth modes are non-protecting, whereby said protecting means provides a protecting mode and a tri-state non-protecting mode.

3. A high voltage transistor breakdown protection circuit according to claim 1 wherein the protection control means comprises:
    command means including first and second FETs each having a first current electrode coupled to a first voltage line, third and fourth FETs each having a first current electrode coupled to a second voltage line, said first and third FETs having second current electrodes connected to a first node, said second and fourth FETs having second current electrodes connected to a second node, said first and second FETs having gate electrodes coupled respectively to said second and first nodes, and said third and fourth FETs having gate electrodes coupled to receive mode command signals, and
    switching means coupled to said command means to apply to said protecting means said first and second signals.

4. A high voltage transistor breakdown protection circuit according to claim 1 adapted to be used in an EPROM memory system.

5. A high voltage transistor breakdown protection circuit according to claim 1 adapted to be used in a nonvolatile RAM memory system.

6. A high voltage transistor breakdown protection circuit according to claim 4 comprising a plurality of said protecting means connected respectively to columns of EPROM memory cells, each said protecting means forming a write amplifier and comprising first, second, third and fourth FETs having current electrodes connected in series between a supply line and a datum line, said first and fourth FETs having gate electrodes coupled to a data input of the amplifier, said second and third FETs having common current electrodes coupled to the output of the amplifier and having gate electrodes coupled respectively to said first and second inputs.

7. A high voltage transistor breakdown protection circuit according to claim 5 comprising a multiplicity of said protecting means each forming part of a RAM cell and comprising first, second, third and fourth FETs having current electrodes connected in series between a supply line and a datum line, said first and fourth FETs having gate electrodes coupled together, said second and third FETs having gate electrodes coupled respectively to said first and second inputs, and fifth, sixth seventh and eighth FETs having current electrodes connected in series between said supply line and said datum line, said fifth and eighth FETs having gate electrodes coupled together, and said sixth and seventh FETs having gate electrodes coupled respectively to said first and second inputs.

8. A high voltage transistor breakdown protection circuit according to claim 3 wherein said switching means comprises a at least one set of first and second FETs having current electrodes coupled in parallel between a first node for receiving a control signal and a second node for coupling to said first input or said second input of said protecting means, said first and second FETs having gate electrodes coupled to said first and second nodes of said command means.

9. A high voltage transistor breakdown protection circuit according to claim 8 wherein said switching means comprises two said sets of first and second FETs, said second nodes of said sets being arranged for coupling respectively to said first and second inputs of said protecting means.

* * * * *